US008394307B2

(12) United States Patent
Ikeda et al.

(10) Patent No.: US 8,394,307 B2
(45) Date of Patent: Mar. 12, 2013

(54) METHOD FOR MANUFACTURING LIQUID DISCHARGE HEAD

(75) Inventors: Masumi Ikeda, Kawasaki (JP); Etsuko Hino, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 351 days.

(21) Appl. No.: 12/634,123

(22) Filed: Dec. 9, 2009

(65) Prior Publication Data

US 2010/0146787 A1 Jun. 17, 2010

(30) Foreign Application Priority Data

Dec. 12, 2008 (JP) ................................ 2008-317277

(51) Int. Cl.
*B29C 33/40* (2006.01)
*H01L 21/00* (2006.01)
*B41J 2/015* (2006.01)
*G01D 15/00* (2006.01)

(52) U.S. Cl. ........ 264/221; 264/129; 264/219; 264/220; 264/222; 264/225; 264/226; 264/313; 264/316; 264/317; 264/DIG. 44; 347/20; 347/40; 347/44; 347/54; 347/65; 347/68; 438/21; 29/890.1; 216/27

(58) Field of Classification Search .................. 264/219, 264/220, 221, 222, 225, 129, 226, 313, 316, 264/317, DIG. 44; 347/20, 40, 44, 54, 65, 347/68; 29/890.1; 438/21; 216/27
See application file for complete search history.

(56) References Cited

U.S. PATENT DOCUMENTS 5,182,579 A 1/1993 Haruta et al.
5,340,702 A * 8/1994 Hirasawa et al. ............. 430/326
5,861,194 A 1/1999 Noguchi et al.
(Continued)

FOREIGN PATENT DOCUMENTS

CN 1464996 A 12/2003
CN 1781058 A 5/2006
(Continued)

OTHER PUBLICATIONS

Apr. 5, 2012 Official Action in Chinese Patent Appln. No. 200910258110.7.

*Primary Examiner* — Christina Johnson
*Assistant Examiner* — Atul P. Khare
(74) *Attorney, Agent, or Firm* — Fitzpatrick, Cella, Harper & Scinto

(57) ABSTRACT

A Method for manufacturing a liquid discharge head having a flow path forming member for forming a liquid flow path which communicates with a discharge port discharging liquid, comprises; preparing a layer containing a compound having a structure represented by Formula (1) and a structure represented by Formula (2) as a main chain on a substrate, (1)

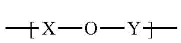

(2)

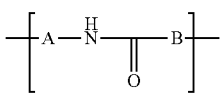

providing a solution in which a resin is dissolved in a compound represented by Formula (3) or (4) on the layer, (3)

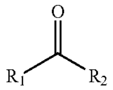

(4)

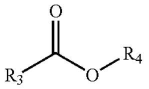

forming a mold having the shape as the flow path from the resin, providing a layer which will become the flow path forming member so as to cover the mold, and removing the mold to form the flow path.

5 Claims, 3 Drawing Sheets

U.S. PATENT DOCUMENTS

| | | | | |
|---|---|---|---|---|
| 5,936,649 | A | 8/1999 | Ikeda et al. | |
| 5,952,401 | A | 9/1999 | Kimura et al. | |
| 6,143,363 | A | 11/2000 | Noguchi et al. | |
| 6,151,042 | A * | 11/2000 | Smith et al. | 347/20 |
| 6,164,772 | A | 12/2000 | Koitabashi et al. | |
| 6,390,606 | B1 | 5/2002 | Terui et al. | 347/63 |
| 7,063,933 | B2 * | 6/2006 | Shiba et al. | 430/270.1 |
| 7,195,857 | B2 * | 3/2007 | Tamura et al. | 430/280.1 |
| 7,465,403 | B2 * | 12/2008 | Kim et al. | 216/27 |
| 2004/0009428 | A1 | 1/2004 | Tamura et al. | |
| 2005/0093924 | A1 | 5/2005 | Shiba et al. | |

FOREIGN PATENT DOCUMENTS

| | | |
|---|---|---|
| JP | 63-006112 | 1/1988 |
| JP | 2-140219 | 5/1990 |

* cited by examiner

METHOD FOR MANUFACTURING LIQUID DISCHARGE HEAD

BACKGROUND OF THE INVENTION

1. Field of the Invention

The present invention relates to a method for manufacturing a liquid discharge head discharging liquid. More specifically, the present invention relates to a method for manufacturing an ink jet recording head discharging micro droplets of recording liquid used in an ink jet recording method.

2. Description of the Related Art

A known example of a liquid discharge head is an ink jet recording head which is used in an ink jet recording method that discharges ink to a recording medium to perform recording thereon.

With the recent demand towards higher image quality and clearer image of printers, it has become necessary to achieve a further reduction in the size of an ink droplet and a discharge port. Thus, it has become extremely important to manufacture and control micro structures such as a nozzle shape with high precision.

Furthermore, with the recent demand towards a further higher image quality of printers, the landing accuracy of ink droplets has become important.

In the related art, a method for manufacturing the ink jet recording head is described, for example, in the specification of U.S. Pat. No. 6,390,606. According to the conventional method, energy generation elements generating an energy used for discharging liquid are formed on a substrate, an adhesion layer is formed on the substrate so as to improve the adhesion between the substrate and a flow path forming material which will be formed later, and an ink flow path pattern made of a dissolvable resin is formed on the adhesion layer. Subsequently, a layer of the flow path forming material used as an ink flow path wall is formed on the ink flow path pattern, a discharge port is formed on each of the energy generation elements by photolithography, and the dissolvable resin is dissolved, and the flow path forming material used as the ink flow path wall is cured.

However, when ink discharge was performed using an ink jet recording head manufactured based on the method described in U.S. Pat. No. 6,390,606, undesirable results were observed such as ink droplets landing on different positions than the desired ones, depending on the diameters of discharge ports, the materials for a discharge port forming member, and the kind of ink.

The present inventors have observed the surface of the discharge ports and found micro particulate matter adhering near the discharge ports. The present inventors have supposed that such particulate matter caused misty ink droplets, called ink mist, generated during the ink discharge to adhere thereto and be accumulated, so that the direction in which the ink droplets are discharged is twisted due to the accumulated ink adhering to the discharge port surface.

As the results of investigation by the present inventors, the following causes are attributable to the adhering of such particulate matter. That is to say, the flow path forming member, the adhesion layer provided between the flow path forming member and the substrate, or an adhesive is dissolved during any of the manufacturing steps and caused to flow to the vicinity of the discharge ports in a later step. In order to physically remove such particulate matter, additional steps for removing the particulate matter and additional machine for removing the particulate matter are required.

Furthermore, as can be seen in recent ink jet recording heads, micro ink droplets of several pL discharged from small discharge ports are easily affected by the ink droplets adhering to the discharge port surface. For this reason, it is desirable to prevent any matter from adhering to the discharge port surface and prevent the adhering matter from affecting discharged ink droplets as much as possible.

SUMMARY OF THE INVENTION

The present invention is made for solving the problems in the related art described above.

An object of the present invention is to provide an ink jet recording head capable of preventing generation of adhering matter on a discharge port surface, suppressing accumulation of ink mist on the discharge port surface, and providing good discharge performance without any twist in its discharge direction even when discharging micro ink droplets. Another object of the present invention is to provide an easy method for manufacturing such an ink jet recording head.

To achieve the object, the present invention provides a method for manufacturing a liquid discharge head having a flow path forming member for forming a liquid flow path which communicates with a discharge port discharging liquid, comprising the steps of; preparing a layer containing a compound having a structure represented by Formula (1) and a structure represented by Formula (2) as a main chain on a substrate,

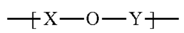

(1)

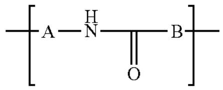

(2)

where X, Y, A, and B each represent independently any one of a saturated hydrocarbon, an unsaturated hydrocarbon, and a substituted or non-substituted aromatic ring, and n is a positive integer, providing a solution in which a resin is dissolved in a compound represented by Formula (3) or (4) on the layer,

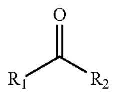

(3)

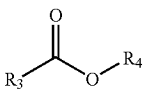

(4)

where $R_1$ to $R_4$ each represent independently a saturated hydrocarbon having 1 to 5 carbon atoms or a hydrocarbon group in which any one of an ester group, an ether group, a keto group, and a hydroxyl group is substituted, forming a mold having the shape as the flow path from the resin, providing a layer which will become the flow path forming member so as to cover the mold, and removing the mold to form the flow path.

According to the present invention, it is possible to manufacture a liquid discharge head in which generation of adhering matter on a discharge port surface is prevented without complicating the manufacturing process. Therefore, it is possible to provide a liquid discharge head capable of suppressing accumulation of ink mist on the discharge port surface and obtaining good discharge performance without any twist in its discharge direction and stably provide a printer with high printing quality even when discharging micro ink droplets.

Further features and aspects of the present invention will become apparent from the following detailed description of exemplary embodiments with reference to the attached drawings.

DESCRIPTION OF THE EMBODIMENTS

Figure 1:
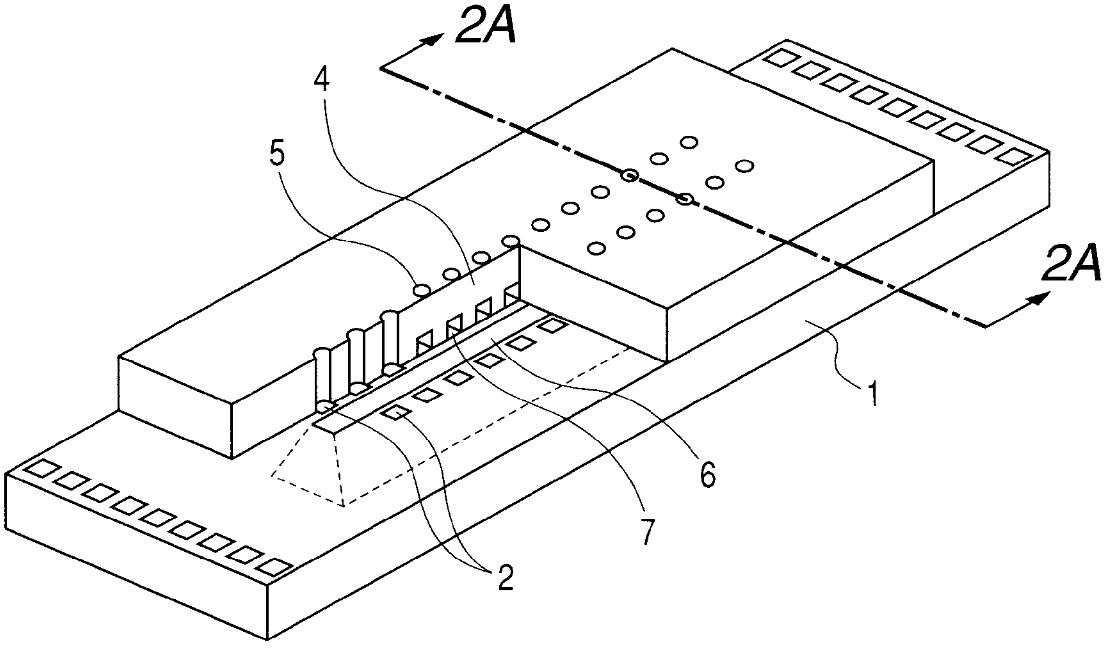
FIG. 1 is a schematic perspective view illustrating an example of a liquid discharge head according to the present invention.

Exemplary embodiments of the present invention will now be described in detail in accordance with the accompanying drawings. In the following description, configurations having the same functions will sometimes be denoted by the same reference numerals throughout the drawings, and descriptions thereof will be omitted.

A liquid discharge head is mounted on printers, copiers, facsimiles having a communicating system, apparatuses having a printer unit, such as word processors, and industrial recording apparatuses combined with various processing apparatuses. When the liquid discharge head is used as an ink jet recording head, for example, the liquid discharge head is able to perform recording on various recording media such as paper, yarn, fiber, cloth, leather, metal, plastic, glass, timber, or ceramics. The term "recording" as used herein refers not only to printing images having meaning such as characters or figures on a recording medium, but also to printing images without meaning such as patterns on a recording medium.

The liquid discharge head according to the present invention may be applied to a full-line recording head capable of performing recording on the entire width of a recording paper at the same time. The liquid discharge head can be equally applied to a color recording head having a configuration in which a plurality of recording head units are integrated with each other and a configuration in which a plurality of separate recording heads are combined with each other.

Figure 2A:
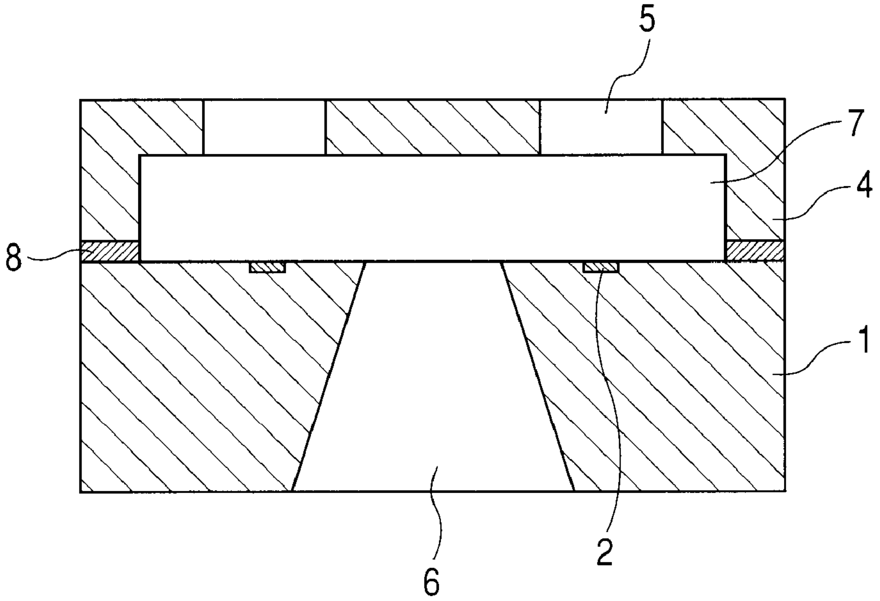
FIGS. 2A and 2B are schematic cross-sectional views illustrating an example of a liquid discharge head according to the present invention.
Figure 2B:
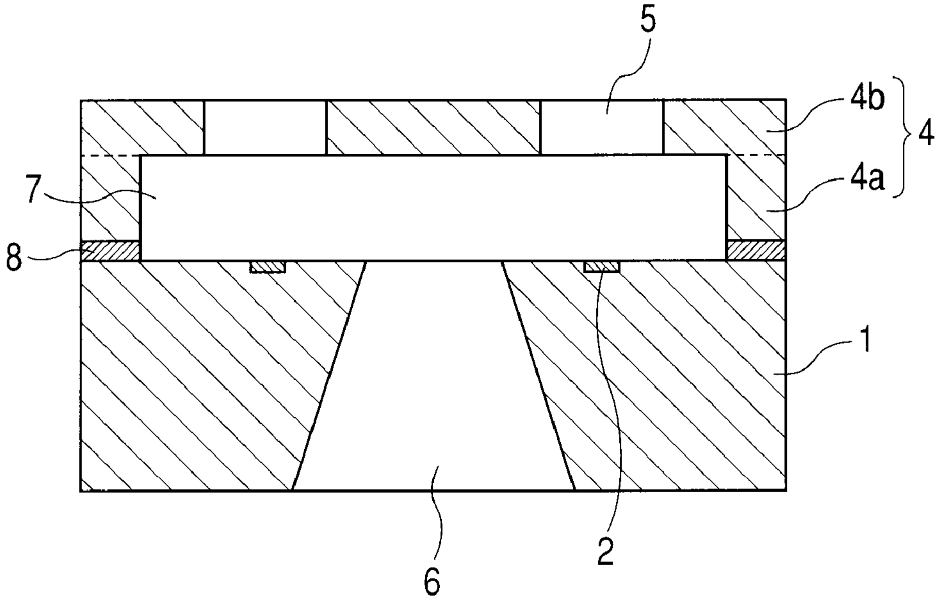

FIG. 1 is a schematic view illustrating a liquid discharge head according to an embodiment of the present invention, illustrating the interior thereof with a portion of a constituent member cut away. FIGS. 2A and 2B are schematic cross-sectional views illustrating an example of a liquid discharge head according to the present invention, taken in a cross section perpendicular to a substrate in a direction parallel to the 2A-2A line in FIG. 1.

The liquid discharge head according to the present embodiment includes an Si substrate 1 on which two rows of energy generation elements 2 are arranged at a predetermined pitch so as to generate an energy used for discharging liquid. A supply port 6 which is formed by anisotropically etching Si is formed in the substrate 1 so as to be opened between the two rows of the energy generation elements 2. On the substrate 1, discharge ports and flow paths 7 are formed by a flow path forming member 4. The discharge ports 5 are disposed at positions opposing the respective energy generation elements 2. The flow paths 7 are configured to communicate with the respective discharge ports 5 via the supply port 6. It should be noted that the positions of the discharge ports are not limited to the above-described positions opposing the energy generation elements 2.

When the liquid discharge head is used as an ink jet recording head, a surface on which the discharge ports 5 are formed is arranged so as to face a recording surface of a recording medium. The liquid discharge head is configured to apply an energy generated by the energy generation elements 2 to ink filled in the flow paths 7 via the supply port 6 so that ink droplets are discharged from the discharge ports 5. The ink droplets are caused to adhere to the recording medium, whereby recording is performed. Non-limiting examples of the energy generation elements include an electro-thermal transducer (so-called heaters) that generates a thermal energy and a piezoelectric element that generates a mechanical energy.

In the example illustrated in FIG. 2A, the flow path forming member 4 is used as a member that forms the discharge ports 5. However, as illustrated in FIG. 2B, the flow path forming member 4 may be formed separately from a member 4*a* that forms the sidewalls of each flow path 7 and a discharge port forming member 4*b* that forms the discharge ports 5.

As illustrated in FIGS. 2A and 2B, a layer 8 which is composed of a polyetheramide and has a plurality of structures represented by Formula (1) (ether bond) and structures represented by Formula (2) (amide bond) in a main chain portion is provided between the flow path forming member 4 and the substrate 1.

$$-\!\!\left[X-O-Y\right]\!\!- \quad (1)$$

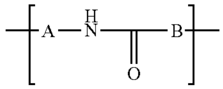

(2)

In the formula, X, Y, A, and B, each represent independently any one of a saturated hydrocarbon, an unsaturated hydrocarbon, and a substituted or non-substituted aromatic ring.

Ether bond and amide bond may exist alternately in the main chain, regularly as shown in the following Formula (12) or in random.

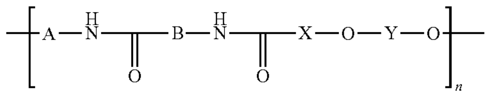

(12)

The layer 8 needs to have excellent adhesion with respect to both an inorganic insulating layer such as SiN or $SiO_2$ formed on the substrate 1 and the organic materials contained in the flow path forming member 4. Furthermore, since such members are highly likely to come into contact with liquid such as ink, the layer 8 needs to maintain excellent adhesion with respect to such members particularly under an alkaline condition. The polyetheramide provides satisfactory adhesion properties to such demands and contributes to enhancing the degree of bonding between the flow path forming member 4 and the substrate 1. In the following description, the layer 8 will be sometimes referred to as an adhesion layer.

Furthermore, the layer 8 preferably has a shape corresponding to the substrate-side shape of the flow path forming member 4.

A resin represented by General Formula (5), for example, can be preferably used as the polyetheramide of the present invention. The polyetheramide resin represented by Formula (5) can be composed by a known method described in Japanese Patent Application Laid-Open No. S63-006112, for example.

(5)

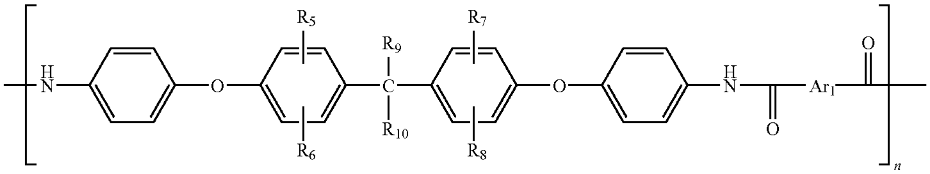

In the formula, $R_5$ to $R_8$, each represent independently any one of a hydrogen atom, an alkyl group having 1 to 4 carbon atoms, an alkoxy group having 1 to 4 carbon atoms, and a halogen atom; $R_9$ and $R_{10}$ each represent independently any one of a hydrogen atom, an alkyl group having 1 to 4 carbon atoms, and a halogenated alkyl group having 1 to 4 carbon atoms; $Ar_1$ represents any one of a substituted or non-substituted phenylene, a substituted or non-substituted biphenylene, and a substituted or non-substituted naphthylene; and n represents a positive integer.

Specifically, a compound having a structure represented by Formulas (6) and (13) below can be used.

(6)

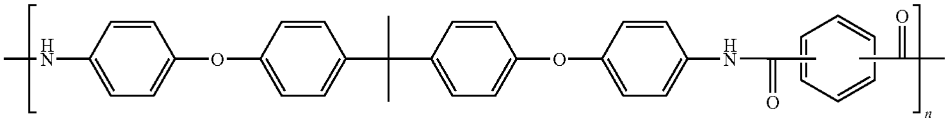

(13)

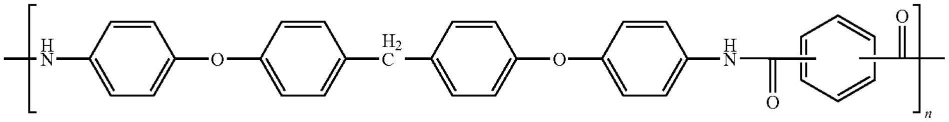

Next, a method for manufacturing the liquid discharge head according to the present invention will be described with reference to FIGS. 3A to 3H.

Figure 3A:
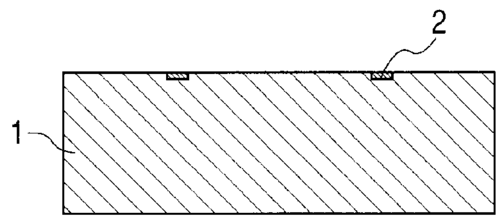
FIGS. 3A, 3B, 3C, 3D, 3E, 3F, 3G and 3H are schematic cross-sectional views illustrating an example of a method for manufacturing the liquid discharge head according to the present invention.
Figure 3B:
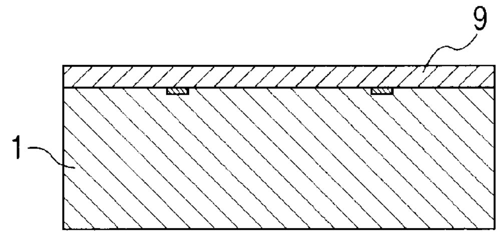

First, as illustrated in FIG. 3A, a substrate 1 having energy generation elements 2 generating an energy used for discharging liquid is prepared. A silicon substrate is used as the substrate 1. Various functional layers such as a protective layer (not illustrated) may be provided for the purpose of enhancing the durability of the energy generation elements 2. For example, films of SiN, SiC, and Ta may be formed on the surface of the substrate 1. Next, as illustrated in FIG. 3B, a polyetheramide resin layer 9 which will become an adhesion layer is formed by a coating method such as a spin-coating method, a roll-coating method, or a slit-coating method.

Figure 3C:
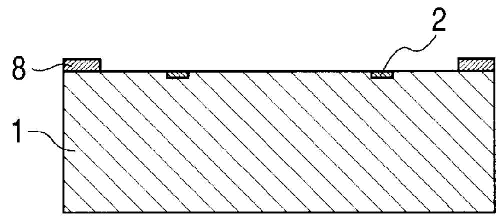

Next, as illustrated in FIG. 3C, the polyetheramide resin layer 9 is patterned to a desired shape by a dry etching, thus forming a polyetheramide layer 8 used as the adhesion layer.

Figure 3D:
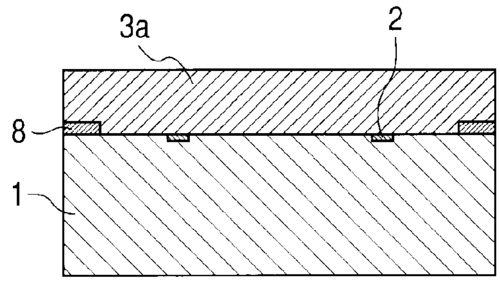

Next, as illustrated in FIG. 3D, a dissolvable resin layer 3*a* is formed on the polyetheramide layer 8 and the substrate 1. The layer 3*a* is used for forming a pattern having the shape of a liquid flow path. The dissolvable resin used at this time needs to be a resin that enables forming of the flow path pattern by any of the known methods and can be dissolved and removed. Various materials can be used such as a resin, and among them, a positive photosensitive resin is particularly preferable because it enables forming of the flow path pattern easily and can be easily dissolved and removed by irradiation of ultraviolet light. Various positive photosensitive resins can be used, and among them, a photodegradable polymer material is preferably used due to its high durability against various manufacturing processes. Examples of the photodegradable polymer material include compounds having a carbonyl group such as poly(methylisopropenylketone), poly(methylmethacrylate), or poly(methylglutarimide). These compounds exhibit properties such that upon absorbing light, portions irradiated with light are degraded by a photo-degradation using their carbonyl group. Furthermore, polyhydroxystyrene-based polymers without a carbonyl group may be used. In addition, after coating polymers, the polymers may be intermolecularly cross-lined to be used as the positive photosensitive resin. These compounds are dissolved in a solvent and coated by a coating method such as a spin-coating method, a roll-'coating method, or a slit-coating method, whereby the dissolvable resin layer 3*a* is formed.

The present inventors have conducted vigorous studies and found that materials of the adhesion layer are contained in the adhering matter on the discharge port surface which was observed in the ink jet recording head manufactured by the conventional method. The adhering matter on the discharge port surface which is associated with the adhesion layer is supposed to be generated because the adhesion layer is dissolved in the step of forming the dissolvable resin layer and caused to flow to the vicinity of the discharge ports in a later step. Therefore, it is preferable to use a solvent capable of suppressing dissolving of the adhesion layer composed of a polyetheramide. On the other hand, since the photodegradable polymer material is generally a polymeric material, a choice of solvents for dissolving such a material is limited. Furthermore, a high-concentration resin solution is needed because the flow paths of the liquid discharge head need to have a thickness of about 3 to 100 μm. For this reason, the dissolvable resin is often used in a state of being dissolved in a polar solvent which is a good solvent of the photodegradable polymer material. However, the polyetheramide used as the adhesion layer is also dissolved in such a highly polar solvent. Therefore, it is desirable to have a solvent that does not dissolve the polyetheramide used as the adhesion layer and dissolves the photodegradable polymer material used as the dissolvable resin well without deteriorating productivity. The present inventors have conducted vigorous studies and found that when the dissolvable resin layer is formed using, as a solvent, an acyclic compound having a carbonyl group and represented by General Formula (3) or (4) below, it is possible to reduce the adhering matter on the discharge port surface.

(3)

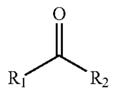

(4)

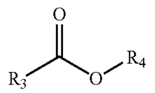

In the formula, $R_1$ to $R_4$ each represent independently a saturated hydrocarbon having 1 to 5 carbon atoms or a monosubstituted hydrocarbon having any one of an ester group, an ether group, a keto group, and a hydroxyl group.

A highly polar solvent may be effectively used for easily dissolving a resin material typified by a photodegradable polymer material as used for forming the flow path mold. However, an excessively high polar solvent may disadvantageously dissolve the polyetheramide used as the adhesion layer. On the contrary, the solvent composed of the acyclic compound used in the present invention is configured to have a balanced property that it dissolves the resin material typified by the photodegradable polymer material as used for forming the flow path mold but has an extremely low ability to dissolve the polyetheramide.

The above-mentioned solvent has such a low ability to dissolve the polyetheramide and is thus supposed to be able to reduce the adhering matter.

Examples of the acyclic compound having a carbonyl group according to the present invention include an acyclic compound having one carbonyl group such as acetone, methyl lactate, ethyl lactate, butyl lactate, methyl-3-methoxypropionate, or ethyleneglycol monomethylether acetate. Furthermore, PGMEA (propyleneglycol monomethylether acetate) may be used. In addition, an acyclic compound having at least two carbonyl groups such as dimethyl malonate, diethyl malonate, acetylacetone, methyl acetoacetate, or ethyl acetoacetate is particularly preferable because it has a good ability to dissolve the photodegradable polymer material. When it is able to dissolve a solution of the photodegradable polymer material, it is possible to form a coating solution having low viscosity. Therefore, it is possible to produce stably an ink jet recording head without any irregularities in the film thickness distribution in a substrate surface, of a coating film formed on the substrate. In addition, in order to enhance the coating property of the positive photosensitive resin, various additives may be added or the above-mentioned acyclic compound having a carbonyl group may be mixed. Other materials may be used without departing from the intention of the present invention.

Most of the photodegradable polymer material used for the positive photosensitive resin has a carbonyl group such as poly(methylisopropenylketone), poly(methyl methacrylate), or poly(methyl glutarimide). This is because the carbonyl group absorbs light and a Norrish-typeI decomposition is realized. The compound represented by Formulas (3) and (4) has a carbonyl group and is thus able to dissolve the photodegradable polymer material having a carbonyl group particularly well. Therefore, it is particularly preferable to use the photodegradable polymer material having a carbonyl group for the resin used for forming the flow path mold.

Figure 3E:
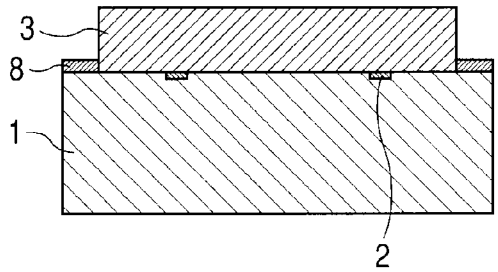

Next, as illustrated in FIG. 3E, the dissolvable resin layer 3*a* is patterned by a photolithographic method, thus forming a desired flow path pattern 3. At this time, the flow path pattern 3 may be formed so as to cover a portion of the layer 8 composed of the polyetheramide or may be formed so that the flow path pattern 3 and the layer 8 are separated from each other.

Figure 3F:
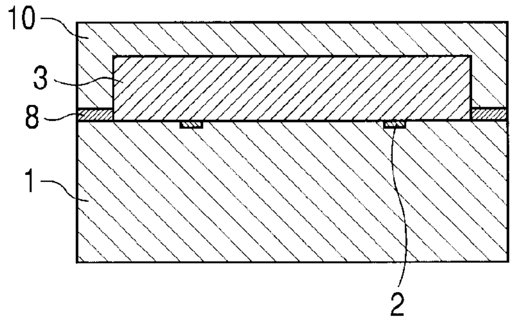

Next, as illustrated in FIG. 3F, a coating layer 10 which will become the flow path forming member 4 is provided on the flow path pattern 3 so as to cover the flow path pattern 3. A material for forming the flow path forming member 4 having a layer thickness of 20 μm is formed by a coating method such as a general spin-coating method, a roll-coating method, or a slit-coating method. In this case, when forming the coating layer 10 which will become the flow path forming member 4, it should be made sure that the flow path pattern 3 is not deformed. That is to say, when the coating layer 10 is laminated on the flow path pattern 3 by a spin-coating or roll-coating method, it is necessary to select a solvent that does not dissolve the dissolvable flow path pattern 3. Moreover, the material for forming the flow path forming member 4 is preferably a photosensitive material so that a later-described discharge port 5 can be formed by photolithography with ease and high accuracy. The material for the coating layer 10 needs to have high mechanical strength as a structural material, high adhesion to a base, high liquid resistance, and high resolution for forming a micro pattern of the discharge port 5. As a material satisfying those properties, a cationic polymerization-type epoxy resin composition can be preferably used.

Examples of the epoxy resin used in the present invention include a reaction product of bisphenol A and epichlorohydrin, having a molecular weight of about 900 or more, a reaction product of bromosphenol A and epichlorohydrin, a reaction product of phenol novolak or o-cresol novolak and epichlorohydrin, and polyfunctional epoxy resins having an oxycyclohexane skeleton described in Japanese Patent Application Laid-Open No. H02-140219. However, the usable epoxy resin is not limited to those compounds.

The usable epoxy compound has an epoxy equivalent of preferably 2000 or lower, and more preferably 1000 or lower. This is because if the epoxy equivalent exceeds 2000, there is the possibility that crosslinking density lowers during curing reaction, and a problem may occur in adhesion and ink resistance.

A compound that generates an acid by light irradiation can be used as a photo-cationic polymerization initiator for curing the epoxy resin. For example, commercially available products such as SP-150, SP-170, or SP-172, produced by ADEKA Co., Ltd. can preferably be used.

If required, additives or the like can appropriately be added to the composition. For example, a flexibility imparting agent may be added for the purpose of decreasing elastic modulus of the epoxy resin, or a silane coupling agent may be added to obtain further adhesion to a base.

Figure 3G:
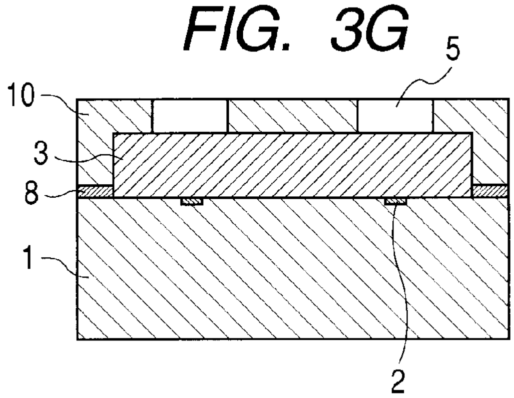

Next, a pattern was exposed on the coating layer 10 via a mask (not illustrated), followed by development, thus forming the discharge port 5 at a position opposing the energy generation element, whereby the state of FIG. 3G is realized.

The pattern-exposed flow path forming member 4 was developed using an appropriate solvent to form the discharge port 5.

Figure 3H:
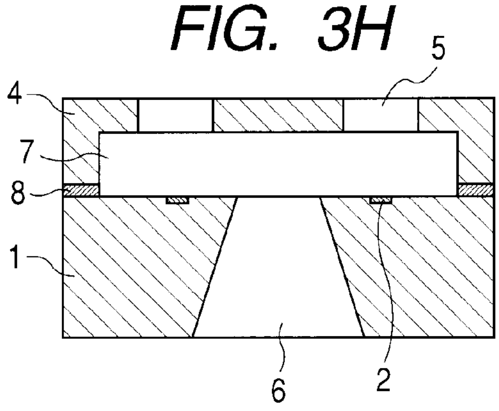

Next, as illustrated in FIG. 3H, a liquid supply port 6 is formed in the substrate so as to communicate with the flow path 7, and the pattern 3 is removed, whereby the flow path 7 and the flow path forming member 4 are obtained.

Furthermore, by applying heat treatment if necessary, the flow path forming member 4 may be further cured. Thereafter, the substrate is bonded with a member (not illustrated) for supplying liquid, and electrical bonding (not illustrated) for driving the energy generation element is performed, thereby completing a liquid discharge head.

The present invention is described below in more detail based on examples.

EXAMPLE 1

Production of Liquid Discharge Head

First, an electro-thermal transducer (a heater made of a TaSiN) used as the energy generation element 2 and a silicon substrate 1 having a laminate film (not illustrated) of SiN and Ta at liquid flow path sites were provided (FIG. 3A).

A polyetheramide resin having a molecular weight Mw of 25000 and represented by Formula (6) was spin-coated on the substrate 1 and dried at 100° C. for 120 seconds.

(6)

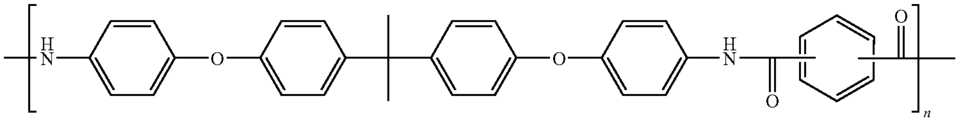

Then, the substrate 1 was baked at 250° C. for 1 hour, thus forming a polyetheramide resin layer 9 which was not patterned (FIG. 2B). At this time, the layer thickness was 3 μm. Dry etching was conducted on the polyetheramide layer 9 by oxygen plasma using a resist (trade name: OFPR800, produced by Tokyo Ohka Kogyo Co., Ltd.), thus forming a layer 8 composed of a polyetheramide used as a patterned adhesion layer.

Next, ethyl lactate (represented by Formula (7) below) which is an acyclic compound having one carbonyl group was used as a solvent that dissolves poly(methylisopropenylketone) used as the positive photosensitive resin, and the solution was adjusted so that the resin concentration became 17 wt %.

(7)

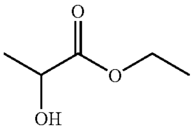

Next, the above-mentioned poly(methylisopropenylketone) solution was spin-coated on the adhesion layer and baked at 120° C. for 6 minutes, thus forming a film. At this time, the layer thickness was 8 μm.

Then, a pattern was exposed on the resulting layer under 8 $J/cm^2$ using UX3000 (produced by Ushio Inc.), followed by development using MIBK, and then rinsed by IPA (isopropyl alcohol), thus forming a pattern as illustrated in FIG. 3E.

Next, a solution in which a resin composition described in Table 1 is dissolved in an appropriate solvent was spin-coated on the substrate and baked at 90° C. for 3 minutes, thus forming a coating film (FIG. 3F). Thereafter, a silane formed from a condensate of a hydrolyzable silane was solvent-coated on the coating layer, thus forming a water repellent layer.

TABLE 1

| Resin composition used for forming flow path forming member | | |
|---|---|---|
| Epoxy resin | Cationic polymerization initiator | Additives |
| EHPE3150<br>100 parts | SP-172<br>2 parts | A-187<br>5 parts |

Next, exposure was conducted using an i-line exposure (produced by Canon Inc.), followed by heating treatment at 90° C. for 4 minutes and development using MIBK, thus forming a discharge port 5 (aperture size: 10 μm) (FIG. 3G).

Next, Si of the substrate was anisotropically etched to form the supply port 6. Thereafter, a protective layer and a flow path pattern disposed on the supply port was removed, and the substrate was heated at 200° C. for 1 hour in order to completely cure the epoxy resin which is a nozzle forming material, thus forming a liquid discharge head (FIG. 3H).

EXAMPLE 2

Methyl 3-methoxypropionate (MMP) (represented by Formula (8) below) which is an acyclic compound having one carbonyl group was used as a solvent that dissolves the positive photosensitive resin, and the resin concentration was controlled to 17 wt %.

(8)

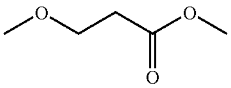

A liquid discharge head was produced by the same process as that of Example 1 except the resin solution was used.

EXAMPLE 3

Acetylacetone (represented by Formula (9) below) which is an acyclic compound having two carbonyl groups was used as a solvent that dissolves the positive photosensitive resin, and the resin concentration was controlled to 20 wt %.

(9)

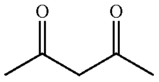

The exposure amount for exposing the positive photosensitive resin was 20 J/$cm^2$. This is because the sensitivity of the positive photosensitive material was decreased from that of Example 1. A liquid discharge head was produced by the same process as that of Example 1 except for the above. The decrease in the sensitivity of the positive photosensitive material is attributable to the acetylacetone which remains in the positive photosensitive resin film and absorbs light.

EXAMPLE 4

Methyl acetoacetate (represented by Formula (10) below) which is an acyclic compound having two carbonyl groups was used as a solvent that dissolves the positive photosensitive resin, and the resin concentration was controlled to 20 wt %.

(10)

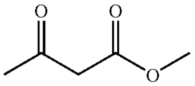

A liquid discharge head was produced by the same process as that of Example 1 except the resin solution was used.

EXAMPLE 5

Ethyl acetoacetate (represented by Formula (11) below) which is an acyclic compound having two carbonyl groups was used as a solvent that dissolves the positive photosensitive resin, and the resin concentration was controlled to 20 wt %.

(11)

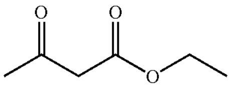

A liquid discharge head was produced by the same process as that of Example 1 except the resin solution was used.

EXAMPLE 6

PGMEA (propyleneglycol monomethylether acetate) (represented by Formula (14) below) which is an acyclic compound having one carbonyl group was used as a solvent that dissolves the positive photosensitive resin, and the resin concentration was controlled to 17 wt %.

(14)

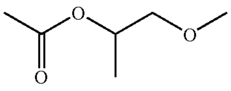

A liquid discharge head was produced by the same process as that of Example 1 except the resin solution was used.

COMPARATIVE EXAMPLE 1

It was attempted to produce a liquid discharge head by the same process as that of Example 1 except ethanol which is an acyclic compound without any carbonyl group was used as a solvent that dissolves the positive photosensitive resin. However, the positive photosensitive resin did not dissolve in the solvent and was unable to be coated.

COMPARATIVE EXAMPLE 2

It was attempted to produce a liquid discharge head by the same process as that of Example 1 except isopropyl alcohol (IPA) which is an acyclic compound without any carbonyl group was used as a solvent that dissolves the positive photosensitive resin. However, the positive photosensitive resin did not dissolve in the solvent and was unable to be coated.

COMPARATIVE EXAMPLE 3

Cyclohexanone which is a cyclic compound having one carbonyl group was used as a solvent that dissolves the positive photosensitive resin, and the resin concentration was controlled to 20 wt %. A liquid discharge head was produced by the same process as that of Example 1 except the resin solution was used.

COMPARATIVE EXAMPLE 4

γ-butyrolactone which is a cyclic compound having one carbonyl group was used as a solvent that dissolves the positive photosensitive resin, and the resin concentration was controlled to 20 wt %. A liquid discharge head was produced by the same process as that of Example 1 except the resin solution was used.

(Evaluation)

The liquid discharge heads produced by the examples and comparative examples were observed using a scanning electron microscope, and the adhering matter on the discharge port surface was examined. In the liquid discharge heads of Examples 1 to 6, substantially no adhering matter, specifically zero to one adhering matter, per a unit area of 1 $\mu m^2$ at the vicinity of the discharge port was observed, and the size of the adhering matter was as small as 0.05 μm or smaller. On the other hand, in the liquid discharge heads of Comparative Examples 3 and 4, much adhering matter, specifically 2 to 30 adhering matter, per a unit area of 1 $\mu m^2$ at the vicinity of the discharge port was observed, and the size of the adhering matter was as large as 0.05 μm to 0.2 μm. This is attributable to the fact that the dissolvable resin layer 3*a* was formed on the adhesion layer without dissolving the adhesion layer.

Furthermore, the positive photosensitive resin solution was spin-coated on a silicon wafer (6 inch) without any steps, and the film thickness distribution of the coating film in the wafer was observed. In Examples 1 and 6, a large thickness difference between the center and the periphery of the silicon wafer was observed at several locations. On the contrary, in Examples 2 to 5 and Comparative Examples 3 and 4, a large thickness difference between the center and the periphery of the silicon wafer was not observed. The large thickness distribution in the wafer observed in Examples 1 and 6 is attributable to the high viscosity of the dissolvable resin solution.

Furthermore, the liquid discharge heads of Examples were dipped in pigment ink for one month under an environment of temperature 30° C. and humidity 80%, and were then mounted on a recording apparatus and printing tests were conducted. Ink droplets were landed at desired landing positions. That is to say, it can be said that good printing results were obtained. On the other hand, the printing tests were conducted using the liquid discharge heads of Comparative Examples under the same conditions as Examples. However, some tests ended up with poor printing results. This is supposed to be attributable to the fact that the ink droplets were twisted in their discharge direction due to the adhering matter observed in the discharge port surface.

The evaluation results are summarized in Table 2. The evaluation criteria used in the table are as follows.

(Adhering Matter)

A: There was substantially no adhering matter per a unit area of 1 $\mu m^2$ at the vicinity of the discharge port, and the size of the adhering matter was 0.05 μm or smaller.

B: There were several to several tens of adhering matter per a unit area of 1 $\mu m^2$ at the vicinity of the discharge port, and the size of the adhering matter was greater than 0.05 μm.

(Sensitivity)

A: Exposure amount necessary for forming flow path pattern was 10 $J/cm^2$ or lower.

B: Exposure amount necessary for forming flow path pattern exceeded 10 $J/cm^2$.

(Film Thickness Distribution)

A: Thickness difference between the center and the periphery of a wafer was less than 3 μm.

B: Thickness difference between the center and the periphery of a wafer was 3 μm or more.

(Twist)

A: Distorted images attributable to the twisted discharge direction were not found.

B: Distorted images attributable to the twisted discharge direction were found.

path which communicates with a discharge port for discharging liquid, the method comprising the steps of:

(a) coating and patterning an adhesion layer containing a compound having a main chain portion having a structure represented by the following Formula (1) and a structure represented by the following Formula (2) onto a substrate comprising energy generation elements:

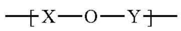
(1)

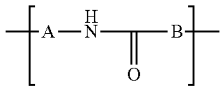
(2)

where X, Y, A, and B each represent independently any one of a saturated hydrocarbon, an unsaturated hydrocarbon, and a substituted or non-substituted aromatic ring;

(b) coating over the adhesion layer a photosensitive layer in which a photosensitive resin is dissolved into a solvent entirely of methyl acetoacetate or ethyl acetoacetate;

(c) patterning the photosensitive layer into a mold having the shape of the desired flow path;

(d) coating and patterning a layer which will become the flow path forming member having the discharge port so as to cover the mold and directly contact the adhesion layer;

(e) forming a liquid supply port in the substrate so as to communicate with the desired flow path; and (f) removing the mold to form the flow path.

TABLE 2

| | Solvent name | Cyclic/Acyclic | Positive photosensitive resin | Number of carbonyl groups | Adhering matters | Sensitivity | Layer Thickness distribution | Twist |
|---|---|---|---|---|---|---|---|---|
| Example 1 | Ethyl lactate | Acyclic | PMIPK | 1 | A | A | B | A |
| Example 2 | MMP | Acyclic | PMIPK | 1 | A | A | A | A |
| Example 3 | Acetyl acetone | Acyclic | PMIPK | 2 | A | B | A | A |
| Example 4 | Methyl acetoacetate | Acyclic | PMIPK | 2 | A | A | A | A |
| Example 5 | Ethyl acetoacetate | Acyclic | PMIPK | 2 | A | A | A | A |
| Example 6 | PGMEA | Acyclic | PMIPK | 1 | A | A | B | A |
| Comparative Example 1 | Ethanol | Acyclic | PMIPK | 0 | Unable to manufacture head | | | |
| Comparative Example 2 | IPA | Acyclic | PMIPK | 0 | Unable to manufacture head | | | |
| Comparative Example 3 | Cyclohexanone | Cyclic | PMIPK | 1 | B | A | A | B |
| Comparative Example 4 | γ-Butyrolactone | Cyclic | PMIPK | 1 | B | A | A | B |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-317277, filed on Dec. 12, 2008, which is hereby incorporated by reference herein in its entirety.

What is claimed is:

1. A method for manufacturing a liquid discharge head having a flow path forming member for forming a liquid flow

2. The method for manufacturing the liquid discharge head according to claim 1, wherein the mold having the shape of the desired flow path is formed so as to cover a portion of the adhesion layer.

3. The method for manufacturing the liquid discharge head according to claim 1, wherein the compound having a structure represented by Formula (1) and a structure represented by Formula (2) as a main chain has a structure represented by Formula (5):

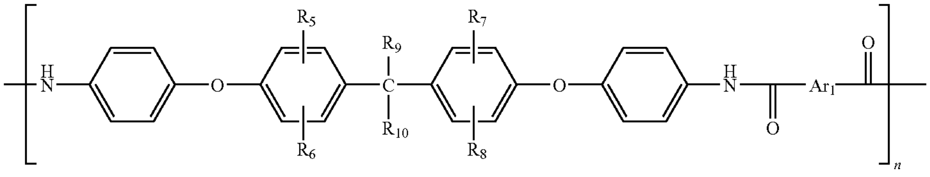

(5)

where $R_5$ to $R_8$ each represent independently any one of a hydrogen atom, an alkyl group having 1 to 4 carbon atoms, an alkoxy group having 1 to 4 carbon atoms, and a halogen atom, where $R_9$ and $R_{10}$ each represent independently any one of a hydrogen atom, an alkyl group having 1 to 4 carbon atoms, and a halogenated alkyl group having 1 to 4 carbon atoms, where $Ar_1$ represents any one of a substituted or non-substituted phenylene, a substituted or non-substituted biphenylene, and a substituted or non-substituted naphthylene, and where n represents a positive integer.

4. The method for manufacturing the liquid discharge head according to claim 1, wherein the photosensitive resin is poly(methylisopropenylketone).

5. The method for manufacturing the liquid discharge head according to claim 1, wherein the solvent is methyl acetoacetate.

* * * * *